United States Patent
Schroeder

(10) Patent No.: US 7,653,864 B2
(45) Date of Patent: *Jan. 26, 2010

(54) METHOD AND APPARATUS TO PERFORM ERROR CONTROL

(75) Inventor: Jacob J. Schroeder, Lyngby (DK)

(73) Assignee: Intel Corporation, Santa Clara, CA (US)

( * ) Notice: Subject to any disclaimer, the term of this patent is extended or adjusted under 35 U.S.C. 154(b) by 87 days.

This patent is subject to a terminal disclaimer.

(21) Appl. No.: 11/489,245

(22) Filed: Jul. 18, 2006

(65) Prior Publication Data

US 2007/0198897 A1    Aug. 23, 2007

(51) Int. Cl.
*H03M 13/03* (2006.01)
(52) U.S. Cl. .................. 714/776; 714/758
(58) Field of Classification Search .......... 714/776, 714/758
See application file for complete search history.

(56) References Cited

U.S. PATENT DOCUMENTS

| 5,606,561 | A | * | 2/1997 | Scheibel et al. | 370/347 |
|---|---|---|---|---|---|
| 6,047,109 | A | * | 4/2000 | Whittaker | 706/13 |
| 6,181,683 | B1 | * | 1/2001 | Chevillat et al. | 370/329 |
| 6,415,329 | B1 | * | 7/2002 | Gelman et al. | 709/245 |
| 6,721,573 | B2 | * | 4/2004 | Silvestri | 455/463 |
| 6,742,045 | B1 | * | 5/2004 | Jordan et al. | 709/238 |
| 6,779,050 | B2 | * | 8/2004 | Horton et al. | 710/30 |
| 6,850,519 | B1 | * | 2/2005 | Saito et al. | 370/389 |
| 7,080,308 | B2 | * | 7/2006 | Schroeder | 714/758 |
| 2003/0039249 | A1 | * | 2/2003 | Basso et al. | 370/394 |
| 2003/0081582 | A1 | * | 5/2003 | Jain et al. | 370/338 |
| 2003/0126272 | A1 | * | 7/2003 | Corl et al. | 709/230 |

FOREIGN PATENT DOCUMENTS

EP    1109373 A2 *  6/2001

* cited by examiner

*Primary Examiner*—M. Mujtaba K Chaudry
(74) *Attorney, Agent, or Firm*—Kacvinsky LLC

(57) ABSTRACT

Embodiments to perform improved error control using packet fragments are described. The apparatus may include a padding module to add a pad byte to uneven packet fragments of a packet, a partial checksum generator module to generate a partial error control value for each packet fragment, a pseudo-header generator module to generate a pseudo header for the packet, and a partial checksum combiner module to combine the partial error control values into an error control value. Other embodiments are described and claimed.

21 Claims, 5 Drawing Sheets

METHOD AND APPARATUS TO PERFORM ERROR CONTROL

BACKGROUND

Error control may refer to techniques to detect and correct errors that may occur in the communication of information between network nodes. The information may be communicated in the form of packets, with each packet comprising a number of packet fragments. Conventional techniques may have difficulties in performing error control for packet fragments, particularly at the speeds demanded by some networks. Consequently, there may be a need for techniques to improve error control for packets having packet fragments.

BRIEF DESCRIPTION OF THE DRAWINGS

The subject matter regarded as embodiments of the invention is particularly pointed out and distinctly claimed in the concluding portion of the specification. Embodiments of the invention, however, both as to organization and method of operation, together with objects, features, and advantages thereof, may best be understood by reference to the following detailed description when read with the accompanying drawings in which:

DETAILED DESCRIPTION

Embodiments of the invention may improve error control for a communications network, such as a packet switching network. One embodiment of the invention improves performance of a packet switching network by improving error control for packet fragmentation. More particularly, one embodiment of the invention may improve network performance by improving error detection for a packet using packet fragments. Such improvements may improve the overall capacity and performance of a network. Accordingly, users may benefit from faster response times from network applications and services.

It is worthy to note that any reference in the specification to "one embodiment" or "an embodiment" means in this context that a particular feature, structure, or characteristic described in connection with the embodiment may be included in at least one embodiment of the invention. The appearances of the phrase "in one embodiment" in various places in the specification do not necessarily all refer to the same embodiment.

Figure 1:
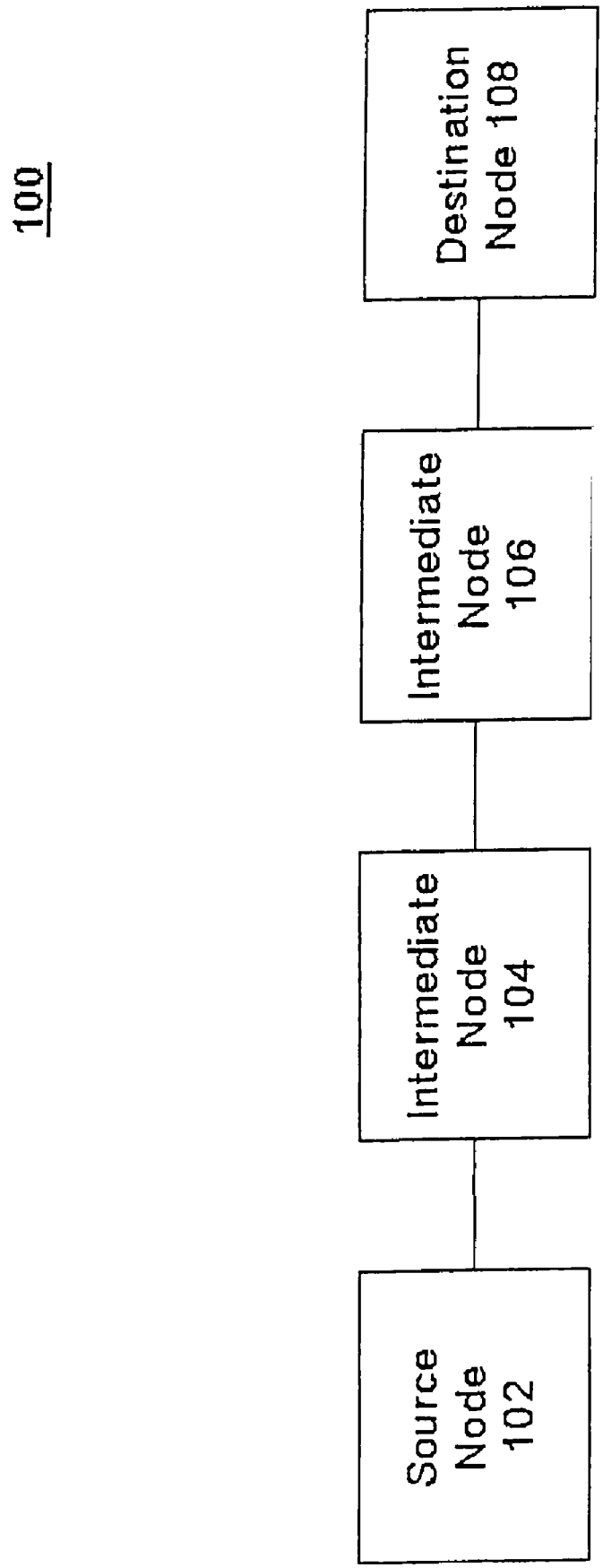
FIG. 1 is a block diagram of a system suitable for practicing one embodiment of the invention.

Referring now in detail to the drawings wherein like parts are designated by like reference numerals throughout, there is illustrated in FIG. 1 a system suitable for practicing one embodiment of the invention. FIG. 1 illustrates a network 100 comprising a source node 102, a first intermediate node 104, a second intermediate node 106 and a destination node 108. Each node may be a network node. Network nodes may comprise, for example, any device capable of communicating information, such as a computer, server, switch, router, bridge, gateway and so forth. Each node may communicate with other nodes in network 100 over a communications medium. The communications medium may comprise any wired or wireless communications medium capable of carrying information signals, such as twisted-pair wire, co-axial cable, fiber optics, radio frequencies and so forth. Although network 100 illustrates only four network nodes for purposes of clarity, it can be appreciated that any number of network nodes may be implemented as part of network 100 and still fall within the scope of the invention.

Network nodes 102, 104, 106 and 108 may be equipped with the appropriate hardware, software or firmware necessary to communicate information in accordance with one or more protocols. A protocol may comprise a set of instructions by which the information signals are communicated over the communications medium. In one embodiment of the invention, the network nodes operate in accordance with a packet switching protocol referred to as the Transmission Control Protocol (TCP) as defined by the Internet Engineering Task Force (IETF) standard 7, Request For Comment (RFC) 793, adopted in September, 1981 ("TCP Specification"), and the Internet Protocol (IP) as defined by the IETF standard 5, RFC 791 ("IP Specification"), adopted in September, 1981, both available from "www.ietf.org",(collectively referred to as the "TCP/IP Specification").

In one embodiment of the invention, network 100 may be configured to operate as a packet switching network. Source node 102 may comprise a node that originates a set of information for delivery to the destination node. Information may comprise any data capable of being represented as a signal, such as an electrical signal, optical signal, acoustical signal and so forth. Examples of information in this context may include data from a voice conversation, videoconference, streaming video, electronic mail ("email") message, voice mail message, graphics, image, video, text and so forth. Destination node 108 may comprise a node that receives information. Intermediate nodes 104 and 106 may comprise nodes that communicate the information between the source node and the destination node. Although network 100 illustrates only two intermediate nodes for purposes of clarity, it can be appreciated that any number of intermediate nodes may be implemented and still fall within the scope of the invention.

In operation, source node 102 may send information to destination node 108 through intermediate nodes 104 and 106 in the form of packets. A packet in this context may refer to a set of information of a limited length, with the length typically represented in terms of bits or bytes. An example of a packet length might be 1000 bytes. Source node 102 may break a set of information into a series of packets. Each packet may contain a portion of the information plus some control information. The control information may assist intermediate node 104 to route each packet to destination node 108. Source node 102 may send the packets to intermediate node 104, which receives the packets, stores them briefly, and passes them to intermediate node 106. Intermediate node 106 then passes the packets to destination node 108. Destination node 108 may receive the entire set of packets and uses them to reproduce the information from source node 102.

There may be instances, however, where the size of an individual packet is too large for communication by intermediate nodes 104 and 106. This may occur, for example, when intermediate nodes 104 and 106 are configured to communicate packets with varying levels of priority. To compensate for this, the intermediate nodes may reduce the size of a packet using a technique referred to as packet fragmentation.

In one embodiment of the invention, packet fragmentation may refer to breaking a packet of information into a series of packet fragments. Each packet fragment typically has a length smaller than the original packet. A length in this context refers to the number of bits or bytes of information comprising the packet or packet fragment. For example, an original packet might have a length of 1500 bytes while a packet fragment might have a length of 100 bytes. Each packet fragment may contain a portion of the information from the original packet plus a fragment header. A fragment header in this context comprises one or more bits representing control information that may assist another node in reassembling the packet fragments into the original packet.

Figure 2:
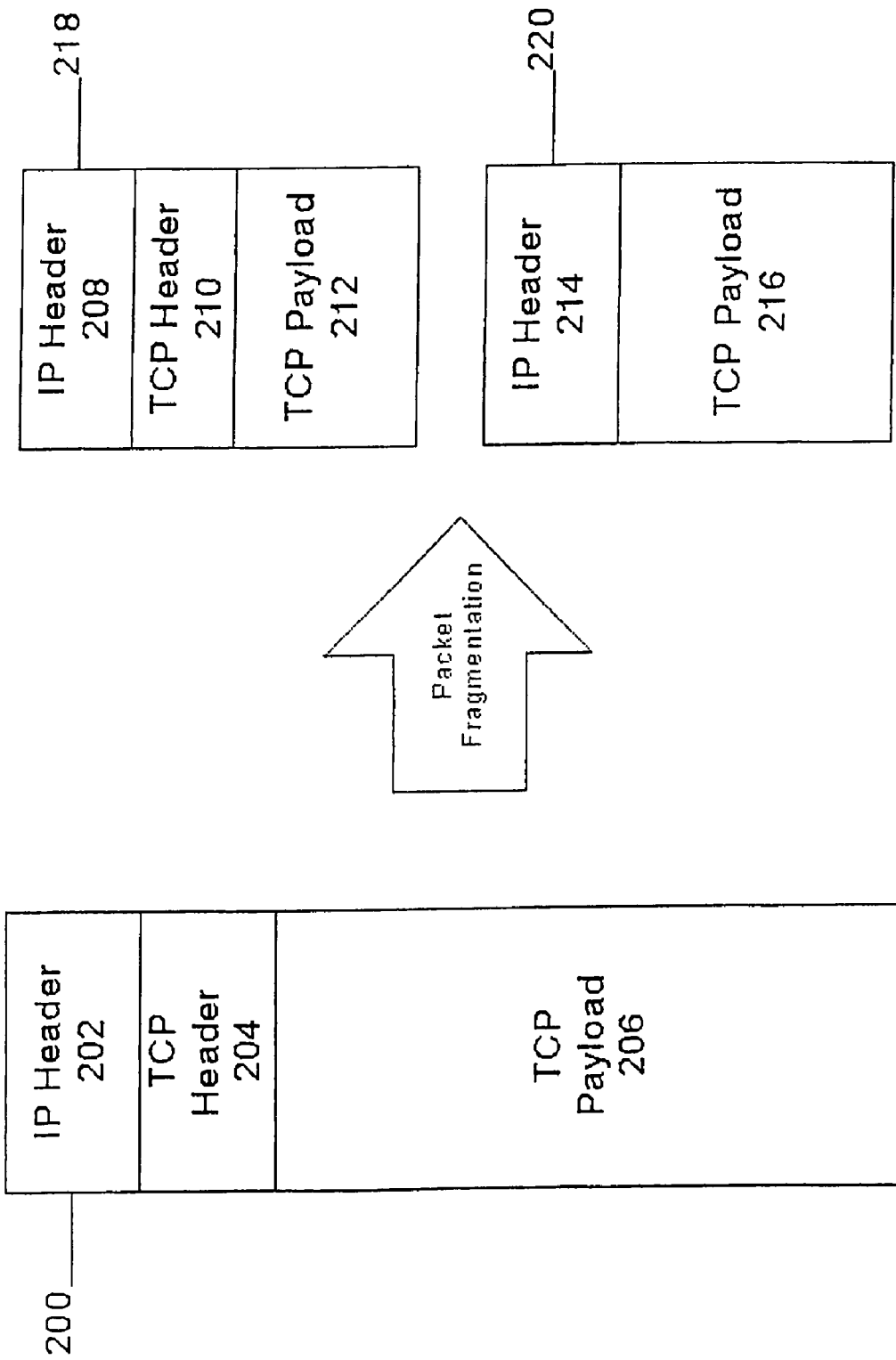
FIG. 2 is a logical representation of packet fragmentation suitable for use with one embodiment of the invention.

FIG. 2 is a logical representation of packet fragmentation suitable for use with one embodiment of the invention. A packet 200 is shown in FIG. 2. Packet 200 may comprise, for example, an IP Header 202, a TCP Header 204 and TCP Payload 206. After packet fragmentation, packet 200 may be separated into packet fragments 218 and 220. Packet fragment 218 may comprise an IP Header 208, a TCP Header 210 and TCP Payload 212. Packet fragment 220 may comprise an IP Header 214 and a TCP Payload 216. Packet fragments 218 and 220 each comprise a portion of packet 200. For example, TCP Payload 212 and 216 comprise a subset of information from TCP Payload 206. Although only two packet fragments are shown in FIG. 2, it can be appreciated that any number of packet fragments may be used and still fall within the scope of the invention.

Intermediate nodes may perform packet fragmentation in accordance with any conventional packet fragmentation protocol. For example, packet fragmentation may be performed in accordance with the IETF Proposed Standard entitled "The Multi-Class Extension To Multi-Link PPP," RFC 2686, published September 1999, available from "www.ietf.org." ("MCML Specification"), the "Frame Relay Fragmentation Implementation Agreement" as defined by FRF Standard 12, adopted in December 1997, available from "www.frforum.com" ("FRF.12 Specification"), and the IP Specification. Although the embodiments of the invention may use a packet fragmentation protocol as defined in the IP Specification, MCML Specification or the FRF. 12 Specification, it can be appreciated that any packet fragmentation protocol may be used and still fall within the scope of the invention.

In addition to packet fragmentation, network 100 may also employ error control technology. Error control may refer to mechanisms to detect and correct errors that occur in the transmission of packets. For example, for a given packet or frame of bits a network node may generate additional bits comprising an error detecting code and add the code to the transmitted frame. The code may be calculated as a function of the other transmitted bits. A receiving node may perform the same calculation and compares the two results. A detected error may occur if there is a mismatch.

The embodiments of the invention may utilize error control in accordance with any number of Internet protocols. For example, one embodiment of the invention may implement error control in accordance with the algorithm set forth in the IETF Informational document entitled "Computing the Internet Checksum," RFC 1071, dated Sep. 1, 1988, and available from "www.ietf.org." ("Internet Checksum Specification")

Packet fragmentation, however, may cause problems for conventional error control techniques. Conventional error control techniques are typically designed to detect errors for a complete packet. Consequently, a network node may have to collect all the packet fragments for a packet prior to performing any error detection, and if needed, any error correction. This may slow down packet processing considerably, and may be intolerable for some high-speed networks. Embodiments of the invention, as described in more detail hereinafter, may reduce this and other problems by managing error control for packet fragmentation in a manner that reduces the need to perform the assembly process prior to performing error detection and correction for a packet.

Figure 3:
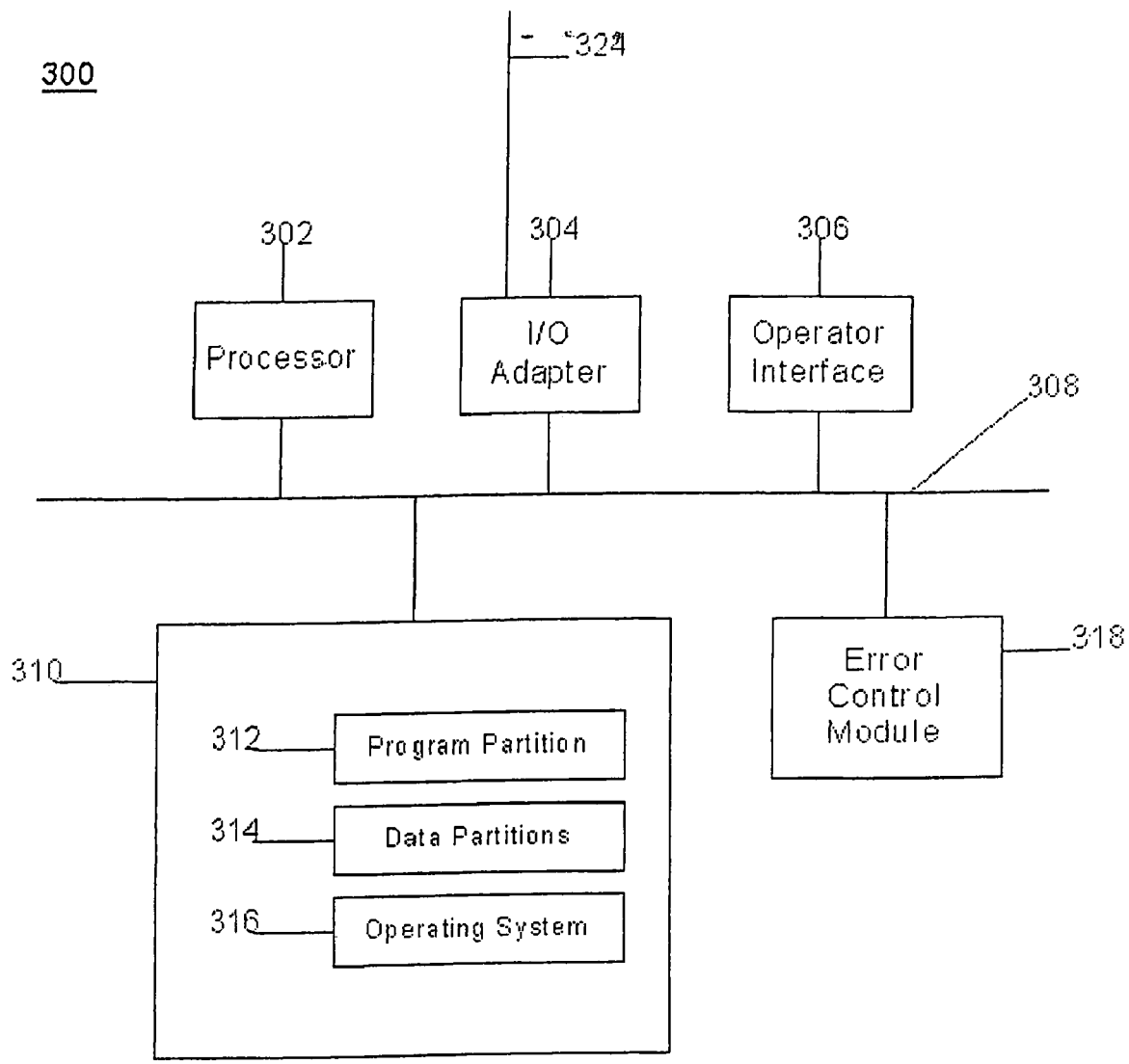
FIG. 3 is a block diagram of a network node in accordance with one embodiment of the invention.

FIG. 3 is a block diagram of a network node in accordance with one embodiment of the invention. FIG. 3 illustrates a node 300 that may be representative of a network node, such as source node 102, intermediate node 104, intermediate node 106 and destination node 108. Node 300 may be, for example, a router configured to perform packet transport and management in accordance with the TCP/IP Specification, packet fragmentation in accordance with the IP Specification, and error control in accordance with the Internet Checksum Specification, although the embodiments are not limited in this context.

In one embodiment of the invention, Node 300 may comprise a computer platform. In this embodiment of the invention, node 300 comprises a processor 302, an input/output (I/O) adapter 304, an operator interface 306, a memory 310, and an error control module (ECM) 318. Memory 310 may store computer program instructions and data. Processor 302 may execute the program instructions, and process the data, stored in memory 310. I/O adapter 304 may communicate with other devices and transfer data in and out of node 300 over connection 324. Operator interface 306 may provide an interface between a user and an operating system (OS) 316. Operator interface 306 may communicate commands between the user and OS 316, and provides status information to the user. All these elements are interconnected by bus 308, which allows data to be intercommunicated between the elements. I/O adapter 304 may represent one or more I/O adapters or network interfaces that can connect to local or wide area networks such as, for example, network 200. Therefore, connection 324 may represent a connection to a network or a direct connection to other equipment. It can be appreciated that node 300 may have any number of I/O adapters and connections, such as I/O adapter 304 and connection 324, and still fall within the scope of the invention.

Processor 302 can be any type of processor capable of providing the speed and functionality desired to implement embodiments of the invention. For example, processor 302 may be a processor from a family of processors made by Intel Corporation, Motorola, Compaq, AMD Corporation and Sun Microsystems.

Memory 310 may comprise any media capable of storing instructions adapted to be executed by a processor. Some examples of such media include, but are not limited to, read-only memory (ROM), random-access memory (RAM), programmable ROM, erasable programmable ROM, electronically erasable programmable ROM, dynamic RAM, magnetic disk (e.g., floppy disk and hard drive), optical disk (e.g., CD-ROM) and any other device or signal that can store digital information. In one embodiment, the instructions may be stored on the medium in a compressed and/or encrypted format. As used herein, the phrase "adapted to be executed by a processor" is meant to encompass instructions stored in a compressed and/or encrypted format, as well as instructions that may be compiled or installed by an installer before being executed by the processor. Further, node 300 may contain various combinations of machine-readable storage devices through other I/O controllers, which are accessible by processor 302 and which are capable of storing a combination of computer program instructions and data.

In one embodiment of the invention, memory 310 comprises OS 316, a program partition 312 and a data partition 314. Program partition 312 may store and allow execution by processor 302 of program instructions that implement the functions of each respective node described herein, such as source node 102, intermediate node 104, intermediate node 106 and destination node 108. Data partition 314 may store data to be used during the execution of program instructions.

I/O adapter 304 may be a network interface that may comprise any suitable technology for controlling communication signals between network devices using a desired set of communications protocols, services and operating procedures. I/O adapter 304 also includes connectors for connecting I/O adapter 304 with a suitable communications medium. Those skilled in the art will understand that I/O adapter 304 may receive information signals over any suitable communication medium such as twisted-pair wire, co-axial cable, fiber optics, radio frequencies, and so forth.

Figure 4:
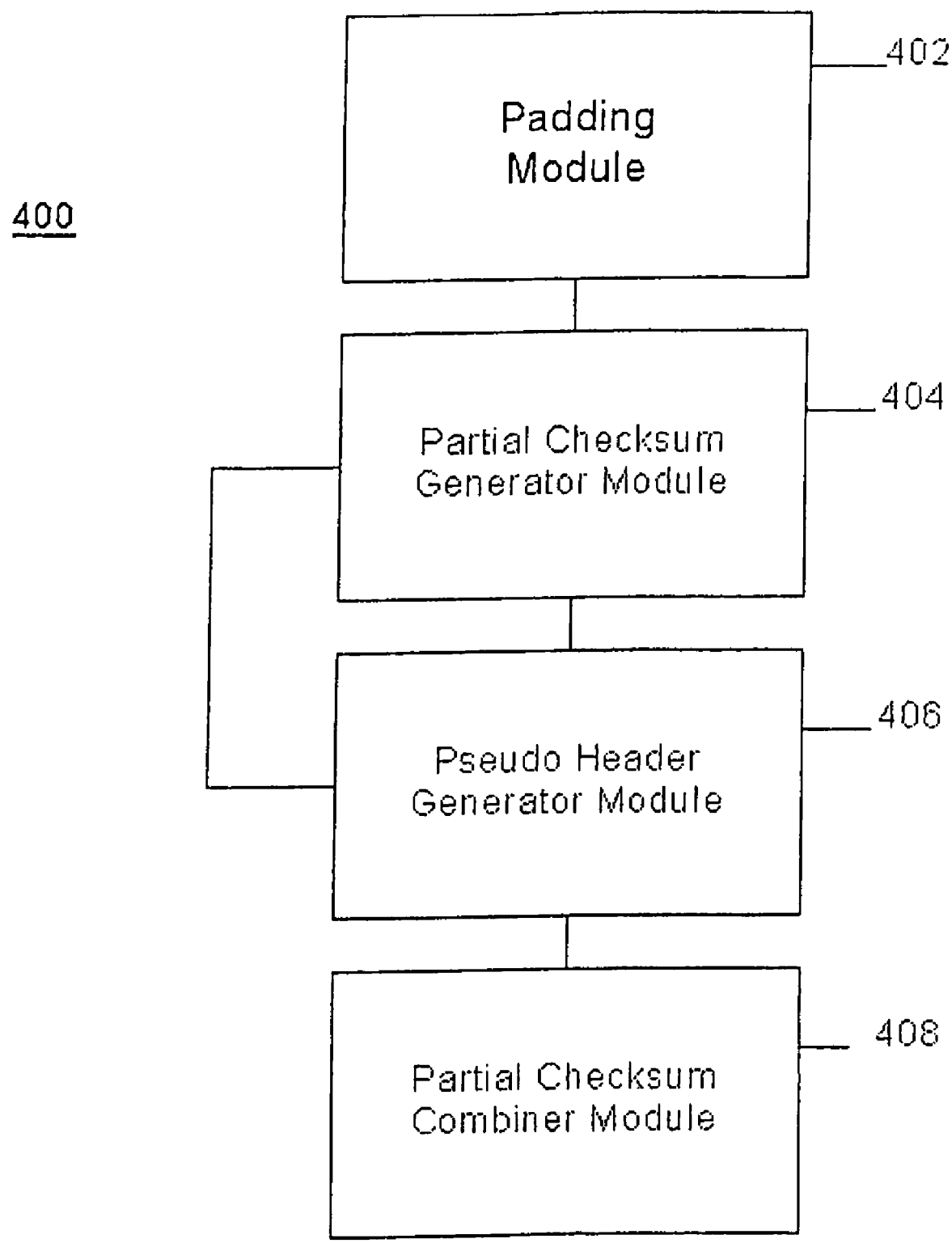
FIG. 4 is a block diagram of an error control module (ECM) in accordance with one embodiment of the invention.

FIG. 4 is a block diagram of an error control module (ECM) in accordance with one embodiment of the invention. FIG. 4 illustrates an ECM 400 that may be representative of ECM 318. In one embodiment of the invention, ECM 400 may comprise, for example, a padding module 402, a partial checksum generator module 404, a pseudo header generator module 406, and a partial checksum combiner module 408. Of course, the scope of the invention is not limited to these particular modules. It can be appreciated that more modules may be used, or these modules may be combined into fewer modules, and still fall within the scope of the invention.

ECM 400 utilizes a number of properties of the TCP checksum algorithm to facilitate implementation of ECM 400 in hardware. This may result in offloading work from the network node processor, such as processor 302, as well as increase packet-processing speed of the network node. This may be accomplished by using two properties of the 1-complement add function of the Internet Checksum Specification. The first property is that appending a 0-byte to a packet fragment does not change its partial checksum. The second property is that a packet fragment with an uneven offset may use the same 1-complement add function as packet fragments having an even offset. Rotating the result one byte may later derive the correct partial checksum, assuming a 2-byte checksum as in the TCP/IP Specification.

ECM 400 may operate to perform error control for a packet by calculating partial TCP checksums for the packet fragments. For example, if the packet is a TCP/IP packet using TCP checksums for error detection, ECM 400 may calculate the TCP checksum for the entire packet by independently calculating a partial error control value for each packet fragment, and combining the partial error control values to form a final error control value. The error control value may then be used as the TCP checksum. The combination of the partial error control value may utilize, for example, a 1-complement add to get the correct partial checksum for a fragment with an even or uneven offset. Since the calculation performed on each packet fragment is independent of the calculation performed on the other packet fragments, the TCP checksum operation may be implemented in hardware to accelerate processing speeds.

In one embodiment of the invention, padding module 402 may be configured to determine the length of a packet fragment. More particularly, padding module 402 may determine whether the length of the packet fragment is even or uneven. This may be accomplished using the IP header. The IP header has a field indicating the length of the packet fragment. If the packet fragment has an even length, then the packet fragment may be sent directly to partial checksum generator module 404. If the packet fragment has an uneven length, then a pad byte may be added to the end of the packet fragment. The pad byte may comprise a zero byte. The padded packet fragment may then be sent to partial checksum generator module 404.

In one embodiment of the invention, partial checksum generator module 404 may receive the padded or unpadded packet fragment, and calculate a partial error control value. The partial error control value may be calculated by performing a 16-bit 1-complement add of the packet fragment payload. The packet fragment payload may comprise, for example, TCP header 210 and TCP payload 212. The partial error control values for each packet fragment may be sent to partial checksum combiner module 408. It is worthy to note that since the packet fragments are always of even length due to the padding operation performed by padding module 402, the same hardware may be used to calculate a partial error control value for even and uneven packet fragments. This increases overall speed of the TCP checksum calculation, thereby increasing packet throughput for the network node.

Padding module 402 and partial checksum generator module 404 may process all of the packet fragments for a packet in a similar manner. This operation may be summarized using the following pseudo-code:

```
IF packet fragment has uneven length THEN add "0" pad byte ENDIF
Partial_Checksum := 16-bit 1-complement add of IP payload.
```

In one embodiment of the invention, pseudo header generator module 406 may generate a pseudo header for the packet. This may be accomplished using information from each packet fragment, as well as the packet fragment header for the last packet, as described in more detail below. Once generated, the pseudo header may be sent to partial checksum generator module 404 to generate a partial error control value. This partial error control value may be sent to partial checksum combiner module 408.

Pseudo header generator module 406 may generate a pseudo header for the packet information retrieved from an IP header of a packet fragment, such as the last packet fragment. The last packet fragment in particular contains the length of the packet for use in calculating the pseudo header. In one embodiment of the invention, the pseudo header may comprise 12 bytes having the following format:

```
|      IP Source Address              |
|      IP Destination Address         |
| 00000000 | Protocol Value | TCP Length |
```

The following fields may be retrieved from the IP header: IP Source Address (32 bits), IP Destination Address (32 bits), and Protocol Value (8 bits). The first byte in the last 32-bit word may be set to zero. The field TCP Length may comprise the total length of the TCP payload and the TCP header for all the packet fragments. This may be calculated using the IP header in the last fragment as follows:

TCP Length=IP.Total_Length+IP.Fragment_Offset−
4*IP.Internet_Header_Length

In one embodiment of the invention, partial checksum combiner module 408 may combine the partial error control values for the packet fragments and the pseudo header into an error control value. This operation may be summarized using the following pseudo-code:

```
Checksum := 0;
FOR all fragments DO
    IF fragment has even offset THEN
        Checksum += Partial_Checksum
    ELSE
        Checksum += Partial_Checksum ROTATE 1 BYTE
ENDLOOP
Checksum += Partial_Checksum PSEUDO HEADER
IF Checksum = 0xFFFF THEN
    Checksum CORRECT
ELSE
    Checksum INCORRECT
```

As shown above, partial checksum combiner module 408 adds each partial TCP checksum together to derive a final TCP checksum. To compensate for the padding operation performed by padding module 402, partial checksum combiner module 408 determines whether a packet fragment had an even or uneven offset. If the packet fragment has an even offset, the partial TCP checksum is added to the checksum using a 16-bit 1-complement add. If the packet fragment has an uneven offset, the partial TCP checksum is rotated by 1 byte and then added to the checksum using the 16-bit 1-complement add. Placing byte 0 in byte 1 and vice-versa may rotate the partial TCP checksum. Once all the partial TCP checksums have been combined, the partial TCP checksum for the pseudo header may be combined to form the final TCP checksum value. The final TCP checksum value may then be used to perform error detection in accordance with, for example, the Internet Checksum Specification.

In one embodiment of the invention, elements of ECM 400 may be implemented in hardware, software or a combination of both. For those elements implemented in software, the appropriate program code segments may be stored in a program partition, such as program partition 312, and executed by processor 302. For example, pseudo header generator module 408 may be implemented by software stored in program partition 312, and executed by processor 302, although the embodiments are not limited in this context.

The operations of systems 100, 200, 300 and 400 may be further described with reference to FIG. 5 and accompanying examples. Although FIG. 5 as presented herein may include a particular processing logic, it can be appreciated that the processing logic merely provides an example of how the general functionality described herein can be implemented. Further, each operation within a given processing logic does not necessarily have to be executed in the order presented unless otherwise indicated.

Figure 5:
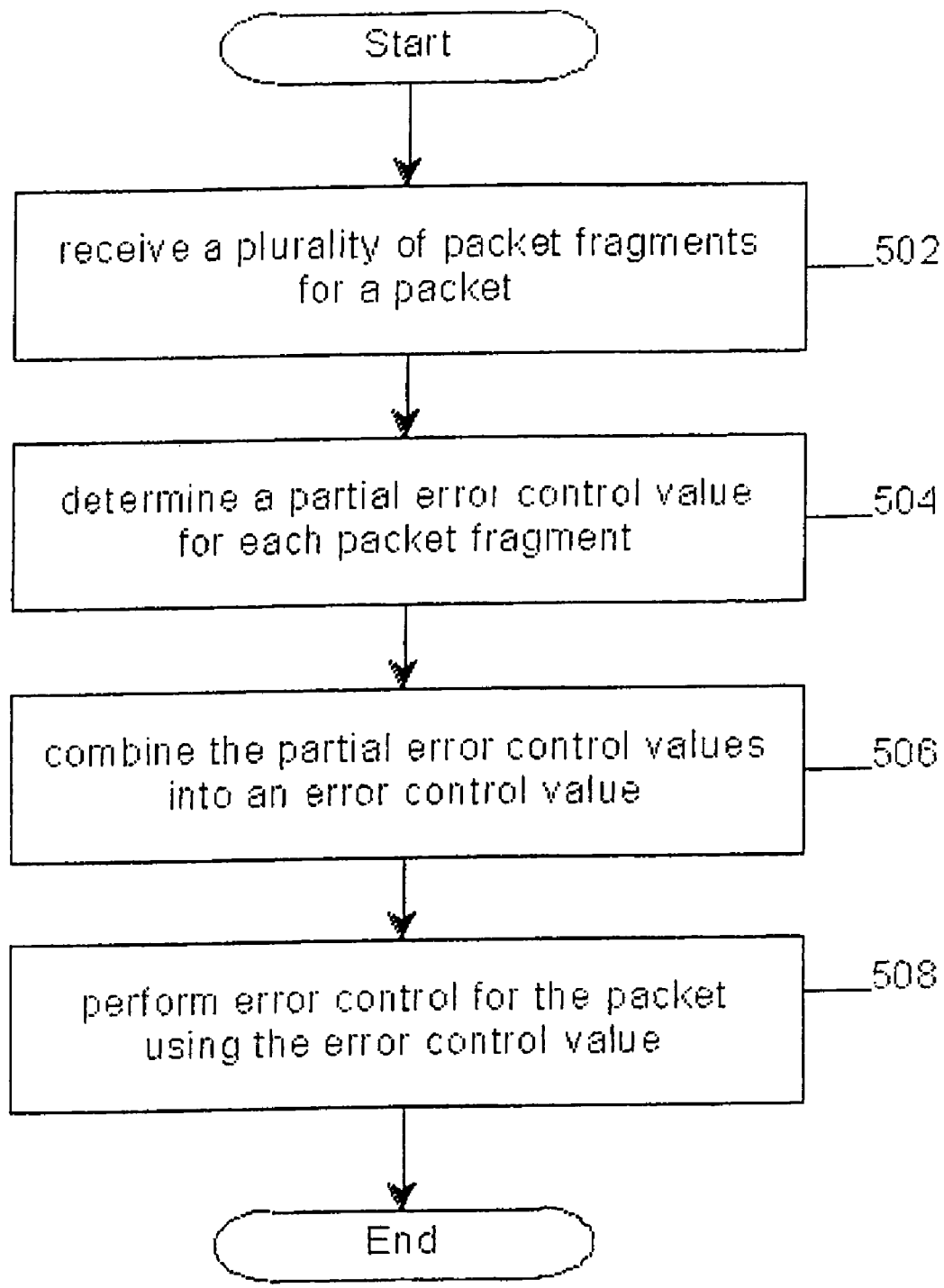
FIG. 5 is a block flow diagram of the processing logic performed by an error control module (ECM) in accordance with one embodiment of the invention.

FIG. 5 is a block flow diagram of the processing logic performed by an error control module (ECM) in accordance with one embodiment of the invention. Processing logic 500 may illustrate a method to perform error control. A plurality of packet fragments for a packet may be received at block 502. A partial error control value for each packet fragment may be determined at block 504. The partial error control values may be combined into an error control value at block 506. Error control may be performed for the packet using the error control value at block 508.

In one embodiment of the invention, a partial error control value for each packet fragment may be determined as follows. A number of bytes for the packet fragment may be determined. A pad byte is added if the number of bytes is uneven. A partial error control value is then calculated.

In one embodiment of the invention, the packet fragment may comprise a header section and a payload section. The partial error control value may then be calculated by performing a 1-complement add of the payload section. The partial error control value may comprise, for example, two bytes.

In one embodiment of the invention, the partial error control values may be combined into an error control value as follows. A determination may be made as to whether a packet fragment has an even or uneven offset. If a packet fragment has an uneven offset, the partial error control value may be rotated by one byte. The partial error control values may then be added to form the error control value.

In addition to generating a partial error control value for each packet fragment, a partial error control value may be generated for a pseudo header. Since the pseudo header includes a total length value for the packet, the pseudo header may be calculated using the packet fragment header for the last packet fragment of the packet. This may be accomplished by, for example, retrieving a source address, destination address and protocol identifier from a header field of the last packet fragment. A packet length may also be determined using the last packet fragment. The source address, destination address, protocol identifier and packet length may be combined to form the pseudo header.

In one embodiment of the invention, the last fragment for a packet may be determined as follows. As discussed with reference to FIG. 2, each packet fragment may include a packet fragment header, such as IP header 208 and 214. The packet fragment header may include, for example, a packet identifier, a more bit and an offset value. A determination may be made as to whether all packet fragments for the packet have been received using the "more bit" of the packet fragment header. More particularly, the packet fragment header for each packet fragment may be evaluated to determine the status of the "more bit." The "more bit" as referred to herein may refer to a flags field that is included as part of a packet fragment header. The more bit may indicate whether more packet fragments are to follow. If the more bit for a packet fragment is set to the predetermined position (e.g., "1" or "0") that indicates that more packet fragments are to follow, then the packet fragment may be stored with other packet fragments having the same packet identifier. Typically, the more bit is set for all packet fragments except for the last packet fragment. The term "packet identifier" as used herein may refer to an identifier for a packet from which the packet fragment was generated.

Once the pseudo header is created, a partial error control value for the pseudo header may be determined. This partial error control value may be added with the other partial error control values to from the error control value. In one embodiment of the invention, the error control values may be TCP checksum values in accordance with the Internet Checksum Specification, and the packet may be a TCP/IP packet in accordance with the TCP/IP Specification.

The operations of systems 100, 200, 300 and 400 may be further described using the following example. Assume source node 102 sends a TCP/IP packet to destination node 108 via intermediate nodes 104 and 106. Intermediate node 104 receives the packet. Prior to forwarding the packet to intermediate node 106, intermediate node 104 performs packet fragmentation on the TCP/IP packet to implement a priority scheme. Intermediate node 104 performs packet fragmentation in accordance with the IP Specification. Intermediate node 104 sends the packet fragments to intermediate node 106.

Intermediate node 106 receives the packet fragments and begins error control in accordance with the Internet Checksum Specification. Although this example shows the following operations occurring at intermediate node 106, it can be appreciated that these operations may be performed at any network node, such as end node 108, and still fall within the scope of the invention.

ECM 400 of intermediate node 106 receives packet fragments and begins partial TCP checksum calculations. Padding module 402 determines an offset for each packet fragment using the offset flag in a field of the IP header of the packet fragment. If the packet fragment has an uneven offset, a zero pad byte is added to the end of the packet fragment, otherwise the packet fragment is left unmodified. The processed packet fragment is sent to partial checksum generator module 404.

Partial checksum generator module 404 performs a 16-bit 1-complement add on the processed packet fragment. The result is a partial error control value in the form of a partial TCP checksum. Padding module 402 and partial checksum generator module 404 performs these operations on all packet fragments until intermediate node 106 receives the last packet fragment for the packet.

Once intermediate node 106 receives the last packet fragment, pseudo header generator module 406 generates a pseudo header for the packet. In this example the pseudo header may be a pseudo IP header. The pseudo IP header is created using values from the IP header of the last packet fragment. Pseudo header generator module 406 sends the pseudo header to partial checksum generator module 404. Padding module 402 may be skipped since the pseudo IP header has an even number of predetermined bytes, i.e., 12 bytes. Partial checksum generator module 404 generates a partial error control value for the pseudo IP header and sends it to partial checksum combiner module 408.

Partial checksum combiner module 408 combines all the partial error control values to form a final error control value, which in this example is a TCP checksum. This may be accomplished by rotating the partial error control values of the packet fragments having an uneven offset by one byte, and performing a 16-bit 1-complement add on all the processed partial error control values.

Once ECM 400 of intermediate node 106 derives a TCP checksum using the packet fragments, intermediate node 106 may perform error control using the TCP checksum using conventional operations. Intermediate node 106 may then forward the packet to destination node 108.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments of the invention.

The invention claimed is:

1. A method for error control, comprising:
receiving a plurality of packet fragments for a packet;
determining a partial error control value for each packet fragment using a pad byte for uneven packet fragments;
combining said partial error control values into an error control value; and
performing error control for said packet using said error control value.

2. The method of claim 1, wherein said packet fragment comprises a header section and a payload section, and said calculating comprises performing a 1-complement add of said payload section.

3. The method of claim 1, wherein said partial error control value comprises two bytes.

4. The method of claim 1, wherein said combining comprises:
determining whether each packet fragment has an even or uneven offset;
rotating each partial error control value by one byte for packet fragments having an uneven offset; and
adding each partial error control value to form said error control value.

5. The method of claim 4, further comprising:
creating a pseudo header for a packet comprising said packet fragments;
determining a partial error control value for said pseudo header; and
adding said partial error control value for said pseudo header to said error control value.

6. The method of claim 5, wherein said creating comprises:
retrieving a source address from a header field of a packet fragment;
retrieving a destination address from said header field;
retrieving a protocol identifier from said header field;
calculating a packet length; and
combining said source address, said destination address, said protocol identifier and said packet length into said pseudo header.

7. The method of claim 1, wherein said error control values are Transmission Control Protocol (TCP) checksum values.

8. The method of claim 1, wherein said packet comprises a TCP and Internet Protocol (IP) packet.

9. An apparatus to perform error control, comprising:
a padding module to add a pad byte to uneven packet fragments of a packet;
a partial checksum generator module to generate a partial error control value for each packet fragment; and
a partial checksum combiner module to combine said partial error control values into an error control value.

10. The apparatus of claim 9, wherein said partial checksum generator module generates a partial error control value using a 16-bit 1-complement add.

11. The apparatus of claim 9, wherein said packet is a TCP/IP packet.

12. The apparatus of claim 9, wherein said error control value is a TCP checksum.

13. The apparatus of claim 9, wherein said partial checksum combiner module rotates partial error control values by one byte for packet fragments having an uneven offset prior to combining.

14. A system to perform error control, comprising:
a computer platform adapted to perform error control;
said platform being further adapted to receive a plurality of packet fragments for a packet, determine a partial error control value for each packet fragment, combine said partial error control values into an error control value, and perform error control for said packet using said error control value and a pad byte for uneven packet fragments.

15. The system of claim 14, wherein said platform is further adapted to perform said combining by determining whether each packet fragment has an even or uneven offset, rotating each partial error control value by one byte for packet fragments with an uneven offset, and adding each partial error control value to form said error control value.

16. The system of claim 15, wherein said platform is further adapted to create a pseudo header for a packet comprising said packet fragments, determine a partial error control value for said pseudo header, and add said partial error control value for said pseudo header to said error control value.

17. The system of claim 16, wherein said platform is further adapted to creating by retrieving a source address from a header field of a packet fragment, retrieving a destination address from said header field, retrieving a protocol identifier from said header field, calculating a packet length, and combining said source address, said destination address, said protocol identifier and said packet length into said pseudo header.

18. An article comprising:
a storage medium;
said storage medium including stored instructions that, when executed by a processor, result in performing error control by receiving a plurality of packet fragments for a packet, determining a partial error control value for each packet fragment, combining said partial error control values into an error control value, and performing error control for said packet using said error control value and a pad byte for uneven packet fragments.

19. The article of claim 18, wherein the stored instructions, when executed by a processor, further result in said combining said partial error control values into said error control value by determining whether each packet fragment has an even or uneven offset, rotating each partial error control value by one byte for packet fragments having an uneven offset, and adding each partial error control value to form said error control value.

20. The article of claim 19, wherein the stored instructions, when executed by a processor, further result in creating a pseudo header for a packet comprising said packet fragments, determining a partial error control value for said pseudo header, and adding said partial error control value for said pseudo header to said error control value.

21. The article of claim 20, wherein the stored instructions, when executed by a processor, further result in creating said pseudo header by retrieving a source address from a header field of a packet fragment, retrieving a destination address from said header field, retrieving a protocol identifier from said header field, calculating a packet length, and combining said source address, said destination address, said protocol identifier and said packet length into said pseudo header.

* * * * *

UNITED STATES PATENT AND TRADEMARK OFFICE
CERTIFICATE OF CORRECTION

| | | |
|---|---|---|
| PATENT NO. | : 7,653,864 B2 | Page 1 of 1 |
| APPLICATION NO. | : 11/489245 | |
| DATED | : January 26, 2010 | |
| INVENTOR(S) | : Jacob J. Schroeder | |

It is certified that error appears in the above-identified patent and that said Letters Patent is hereby corrected as shown below:

On the Title page, in field (56), "U.S. Patent Documents", column 2, line 5, delete "Jordan et al." and insert -- Albert et al. --, therefor.

Signed and Sealed this

Sixteenth Day of March, 2010

David J. Kappos
*Director of the United States Patent and Trademark Office*